United States Patent
Lee et al.

(10) Patent No.: US 12,074,155 B2
(45) Date of Patent: *Aug. 27, 2024

(54) DISPLAY DEVICE

(71) Applicant: Samsung Display Co., Ltd., Yongin-Si (KR)

(72) Inventors: Dae Geun Lee, Hwaseong-si (KR); Kyung Mok Lee, Bucheon-si (KR); Suk Ho Choi, Seongnam-si (KR)

(73) Assignee: Samsung Display Co., Ltd., Yongin-si (KR)

(*) Notice: Subject to any disclaimer, the term of this patent is extended or adjusted under 35 U.S.C. 154(b) by 27 days.

This patent is subject to a terminal disclaimer.

(21) Appl. No.: 17/959,670

(22) Filed: Oct. 4, 2022

(65) Prior Publication Data

US 2023/0026637 A1    Jan. 26, 2023

Related U.S. Application Data

(63) Continuation of application No. 17/191,561, filed on Mar. 3, 2021, now Pat. No. 11,495,591, which is a (Continued)

(30) Foreign Application Priority Data

Apr. 20, 2018    (KR) .................. 10-2018-0046258

(51) Int. Cl.
*H01L 25/18*    (2023.01)
*H01L 23/00*    (2006.01)
(Continued)

(52) U.S. Cl.
CPC .............. *H01L 25/18* (2013.01); *H01L 24/16* (2013.01); *H01L 24/32* (2013.01); *H01L 24/73* (2013.01);
(Continued)

(58) Field of Classification Search
CPC ......... H01L 25/18; H01L 24/32; H01L 24/73; H01L 24/16
See application file for complete search history.

(56) References Cited

U.S. PATENT DOCUMENTS 5,951,304 A     9/1999  Wildes et al.
9,281,346 B1 *  3/2016  Lim .................... H01L 24/17
(Continued)

FOREIGN PATENT DOCUMENTS

CN          103576350 A     2/2014
CN          105654856 A     6/2016
(Continued)

*Primary Examiner* — Christine A Enad
(74) *Attorney, Agent, or Firm* — Innovation Counsel LLP

(57) ABSTRACT

The display device includes a flexible base layer including a first region and a second region located around the first; a display unit on one surface of the first region and including a light emitting element; a driving circuit on the second region and including a plurality of first bumps arranged in a first row and a plurality of second bumps arranged in a second row, the driving circuit includes a third bump in the first row and disposed outward relative to the plurality of first bumps, a first and second reference bump each disposed at a center of the plurality of first and second bumps that are disposed along a reference line defined in a column direction vertically intersecting a row direction, the remaining first and second bumps excluding the first reference bump and the second reference bump arranged to have a preset slope with respect to the reference line.

5 Claims, 12 Drawing Sheets

Related U.S. Application Data continuation of application No. 16/262,607, filed on Jan. 30, 2019, now Pat. No. 10,964,680.

(51) Int. Cl.
*H10K 59/131* (2023.01)
*H10K 77/10* (2023.01)
*H10K 102/00* (2023.01)

(52) U.S. Cl.
CPC ......... *H10K 59/131* (2023.02); *H10K 77/111* (2023.02); *H01L 2224/16145* (2013.01); *H01L 2224/17152* (2013.01); *H01L 2224/32145* (2013.01); *H01L 2224/73204* (2013.01); *H01L 2924/1426* (2013.01); *H10K 2102/311* (2023.02)

(56) References Cited

U.S. PATENT DOCUMENTS

| | | |
|---|---|---|
| 9,591,754 B2 | 3/2017 | Lee |
| 9,917,113 B2 | 3/2018 | Lee |
| 10,242,605 B2 | 3/2019 | Chen et al. |
| 10,373,987 B2 | 8/2019 | Lee |
| 11,081,503 B2 | 8/2021 | Lee |
| 11,495,591 B2 * | 11/2022 | Lee .................. H01L 25/18 |
| 2004/0262035 A1 | 12/2004 | Ko et al. |
| 2014/0029226 A1 | 1/2014 | Abe et al. |
| 2015/0091163 A1 | 4/2015 | Kim |
| 2015/0348930 A1 * | 12/2015 | Jeong ............. H01L 23/49838 |
| | | 257/737 |
| 2015/0366049 A1 | 12/2015 | Lee |
| 2018/0047314 A1 | 2/2018 | Chen et al. |
| 2021/0366938 A1 | 11/2021 | Lee |

FOREIGN PATENT DOCUMENTS

| | | |
|---|---|---|
| CN | 105762153 A | 7/2016 |
| KR | 10-2006-0034034 A | 4/2006 |
| KR | 10-2015-0117999 A | 10/2015 |
| KR | 2015-0144907 A | 12/2015 |
| KR | 10-2016-0043571 A | 4/2016 |
| KR | 2016-0085038 A | 7/2016 |

* cited by examiner

DISPLAY DEVICE

This application is a continuation application of U.S. patent application Ser. No. 17/191,561 filed on Mar. 3, 2021, which is a continuation application of U.S. patent application Ser. No. 16/262,607 filed on Jan. 30, 2019 (now U.S. Pat. No. 10,964,680), which claims priority to Korean Patent Application No 10-2018-0046258 filed on Apr. 20, 2018 in the Korean Intellectual Property Office, the disclosures of which are incorporated herein by reference in their entirety.

BACKGROUND

1. Field of the Invention

The present inventive concept relates to a display device.

2. Description of the Related Art

A display device is a device for visually displaying data. Such a display device includes a substrate partitioned into a display area and a non-display area. A display unit is disposed on the substrate in the display area, and a pad or the like is disposed on the substrate in the non-display area. The pad is provided with a driving circuit to transmit a driving signal to the display unit.

Meanwhile, the driving circuit may be mounted on the substrate through pressing and heating processes. When the substrate is made of a flexible material, the substrate is bent by pressing, and thus the display unit may be detached from the substrate.

SUMMARY

An aspect of the present inventive concept is to provide a display device having improved durability and reliability.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to an exemplary embodiment of the invention, there is provided a display device. The display device may include:

a flexible base layer including a first region and a second region located around the first region; a display unit disposed on one surface of the first region and including a light emitting element; and a driving circuit disposed on the second region and including a plurality of first bumps arranged in a first row and a plurality of second bumps arranged in a second row, wherein the driving circuit includes a third bump disposed in the first row and disposed outward relative to the plurality of first bumps, a first reference bump and a second reference bump each disposed at a center of the plurality of first and second bumps, the plurality of first and second reference bumps disposed along a reference line defined in a column direction vertically intersecting a row direction, and the remaining first and second bumps excluding the first reference bump and the second reference bump are arranged to have a preset slope with respect to the reference line.

In an exemplary embodiment, the plurality of first bumps may include a plurality of eleventh bumps arranged at a left side of the first reference bump and a plurality of twelfth bumps arranged at a right side of the first reference bump, and the plurality of eleventh bumps are arranged to form an acute angle in a clockwise direction with respect to the reference line, and the plurality of twelfth bumps are arranged to form an acute angle in a counterclockwise direction with respect to the reference line.

In an exemplary embodiment, a shortest distance from an end of the flexible base layer to the first bump may be greater than a shortest distance from the end of the flexible base layer to the second bump.

In an exemplary embodiment, the third bump may be disposed between the end of the flexible base layer and the first bump.

In an exemplary embodiment, a shortest distance from an end of the flexible base layer to the third bump may be equal to a shortest distance from the end of the flexible base layer to the second bump.

In an exemplary embodiment, a difference between a shortest distance from an end of the flexible base layer to the third bump and a shortest distance from the end thereof to the second bump may be about 30 μm or less.

In an exemplary embodiment, a thickness of the first bump may be equal to a thickness of the third bump.

In an exemplary embodiment, the thickness of the first bump may be greater than the thickness of the third bump.

In an exemplary embodiment, the plurality of first bumps and the plurality of second bumps may be output bumps outputting a driving signal for driving the display unit.

In an exemplary embodiment, the third bump may be an output bump configured to output a driving signal for driving the display unit.

In an exemplary embodiment, the third bump may be a dummy bump.

In an exemplary embodiment, the driving circuit may include a plurality of third bumps and a fourth bump arranged in a third row, and the fourth bump is disposed between an end of the flexible base layer and the plurality of third bumps.

In an exemplary embodiment, the third bump may be an input bump configured to receive a signal from the outside.

According to an exemplary embodiment of the invention, there may be provided a display device. The display device may include:

a flexible base layer including a first region and a second region located around the first region; a display unit disposed on one surface of the first region and including a light emitting element; and a driving circuit disposed on the second region and including a plurality of first bumps arranged in a first row and a plurality of second bumps arranged in a second row, wherein the number of the plurality of first bumps is greater than the number of the plurality of second bumps, a first reference bump and a second reference bump each disposed at a center of the plurality of first and second bumps, the plurality of first and second reference bumps disposed along a reference line defined in a column direction vertically intersecting a row direction, and the remaining first and second bumps excluding the first reference bump and the second reference bump are arranged to have a preset slope with respect to the reference line.

In an exemplary embodiment, the plurality of first bumps are disposed adjacent to the display unit relative to the plurality of second bumps.

In an exemplary embodiment, the plurality of first bumps may include a plurality of eleventh bumps arranged at a left side of the first reference bump and a plurality of twelfth bumps arranged at a right side of the first reference bump, and the plurality of eleventh bumps are arranged to form an acute angle in a clockwise direction with respect to the reference line, and the plurality of twelfth bumps are arranged to form an acute angle in a counterclockwise direction with respect to the reference line.

In an exemplary embodiment, a shortest distance from an end of the flexible base layer to the first bump may be equal to a shortest distance from the end of the flexible base layer to the second bump.

In an exemplary embodiment, a difference between a shortest distance from an end of the flexible base layer to the third bump and a shortest distance from the end of the flexible base layer to the second bump is about 30 μm or less.

In an exemplary embodiment, the plurality of second bumps may be disposed adjacent to the display unit relative to the plurality of first bumps.

In an exemplary embodiment, the plurality of first bumps may include a plurality of eleventh bumps arranged at a left side of the first reference bump and a plurality of twelfth bumps arranged at a right side of the first reference bump, and the plurality of eleventh bumps are arranged to form an obtuse angle in a clockwise direction with respect to the reference line, and the plurality of twelfth bumps are arranged to form an obtuse angle in a counterclockwise direction with respect to the reference line.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
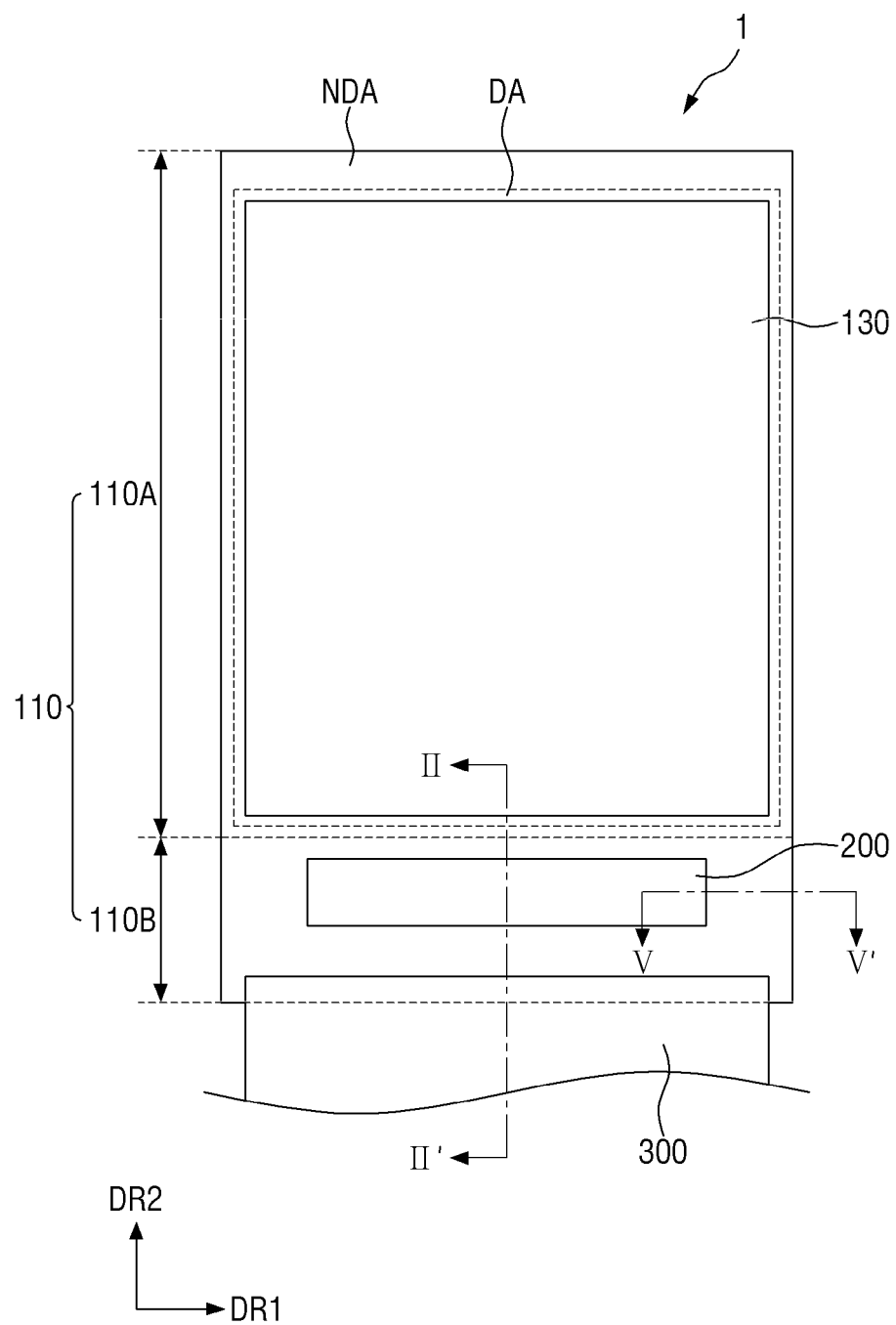
FIG. 1 is a plan view of a display device according to an embodiment.

The advantages and features of the inventive concept and methods for achieving the advantages and features will be apparent by referring to the embodiments to be described in detail with reference to the accompanying drawings. However, the inventive concept is not limited to the embodiments disclosed hereinafter, but can be implemented in diverse forms.

Where an element is described as being related to another element such as being "on" another element or "located on" a different layer or a layer, includes both a case where an element is located directly on another element or a layer and a case where an element is located on another element via another layer or still another element. In contrast, where an element is described as being is related to another element such as being "directly on" another element or "located directly on" a different layer or a layer, indicates a case where an element is located on another element or a layer with no intervening element or layer therebetween.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

The embodiments described herein will be described with reference to plan views and cross-sectional views, which are ideal schematics of the present inventive concept. Thus, the shape of the illustrations may be modified by manufacturing techniques and/or permittable errors. Thus, it is to be understood that the embodiments are not limited to the specific forms shown, but may include variations in form that are created according to the fabrication process. Thus, the regions depicted in the figures have schematic attributes, and the shapes of the regions depicted in the figures are intended to illustrate specific forms of regions of the elements and are not intended to limit the scope of the invention.

Throughout the specification, the same reference numerals are used for the same or similar parts.

Hereinafter, embodiments of the present inventive concept will be described with reference to the attached drawings.

A display device, which is a device for displaying a moving image or a still image, may be used as a display screen of various products such as televisions, notebooks, monitors, billboards, things of internet as well as portable electronic appliances such as mobile phones, smart phones, tablet personal computers (PCs), smart watches, watch phones, mobilee communication terminals, electronic notebooks, electronic books, portable multimedia players (PMPs), navigators, and ultra-mobile PCs (UMPCs). Examples of the display device may include an organic light emitting display (OLED), a liquid crystal display (LCD), a plasma display (PDP), a field emission display (FED), and an electrophoretic display (EPD).

Hereinafter, an organic light emitting display device will be described as an example of the display device, but the present inventive concept is not limited thereto.

Figure 2:
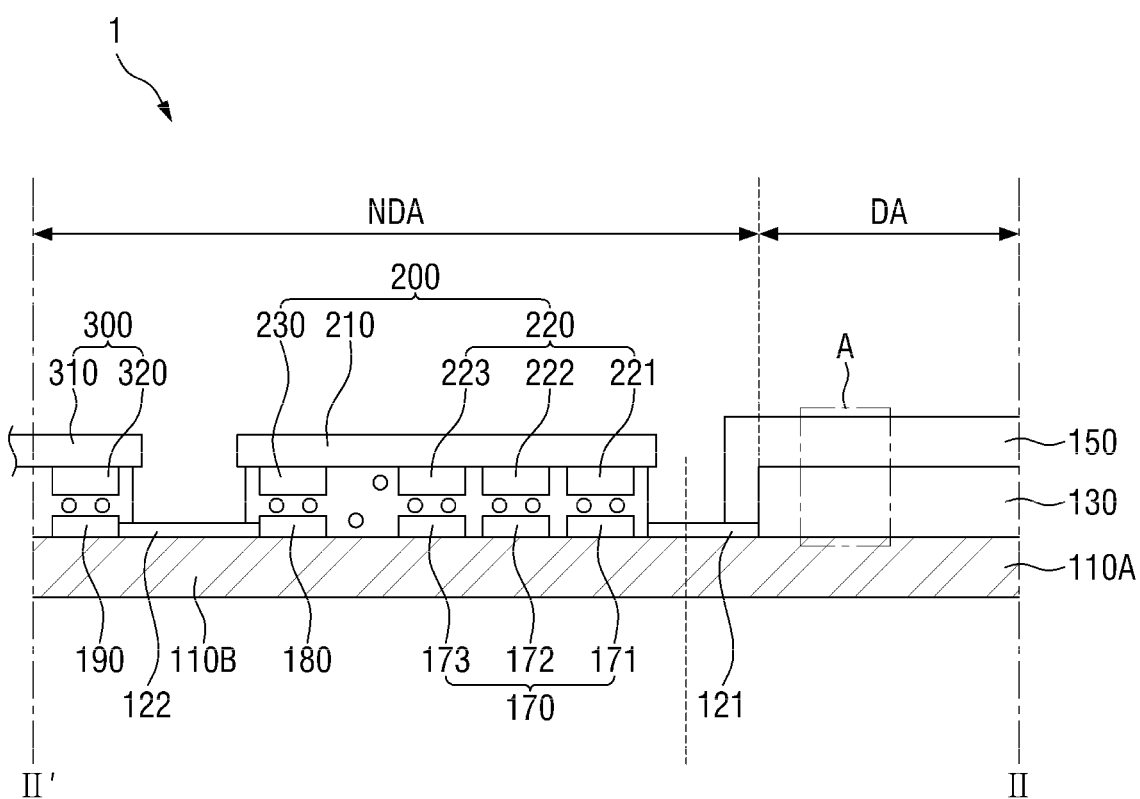
FIG. 2 is a cross-sectional view taken along the line II-II' in FIG. 2.
Figure 3:
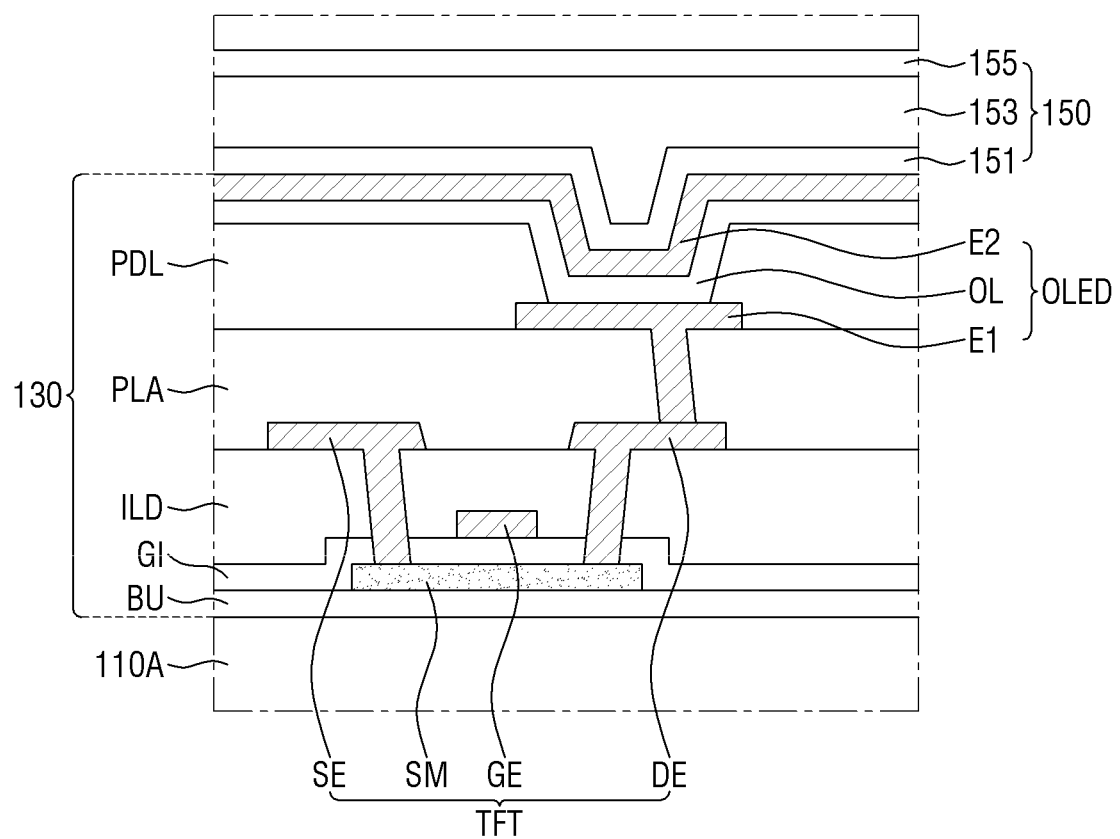
FIG. 3 is an enlarged cross-sectional view of area A in FIG. 2.

FIG. 1 is a plan view of a display device according to an embodiment, FIG. 2 is a cross-sectional view taken along the line II-II' in FIG. 2, and FIG. 3 is an enlarged cross-sectional view of area A in FIG. 2.

Referring to FIGS. 1 to 3, the display device 1 according to the present embodiment includes a display area DA and a non-display area NDA around the display area DA. The display area DA is an area where an image is displayed, and the non-display area NDA is an area where an image is not displayed.

The display device 1 may include a flexible base layer 110, a display unit 130, and a driving circuit 200. The display device 1 may further include a circuit board unit 300 and an encapsulation unit 150.

The flexible base layer 110 may be an insulating substrate. In an embodiment, the flexible base layer 110 may include a flexible polymer material. Here, the polymer material may be polyimide (PI), polyethersulphone (PES), polyacrylate (PA), polyarylate (PAR), polyetherimide (PEI), polyethylenepthalate (PEN), polyethyleneterepthalate (PET), polyphenylenesulfide (PPS), polyallylate, polyimide (PI), polycarbonate (PC), cellulose triacetate (CAT), cellulose acetate propionate (CAP), or a combination thereof.

The flexible base layer 110 may include a first region 110A and a second region 110B. The display area DA in which the display unit 130 is disposed may be defined in the first region 110A, and one area of the non-display area NDA may be defined in the first region. The other area of the non-display area NDA may be defined in the second region 110B, and the driving circuit 200 may be disposed in the second region 110B.

The display unit 130 may be disposed on the first region 110A of the flexible base layer 110, and the encapsulation unit 150 may be disposed on the display unit 130.

The display unit 130 includes a thin film transistor TFT as a switching element and a light emitting element OLED connected to the thin film transistor TFT, and may further include a buffer layer BU, a gate insulation film GI, an interlayer insulation film ILD, a planarization film PLA, a pixel defining film PDL, a gate line (not shown), and a data line (not shown).

The buffer layer BU may be disposed on the first region 110A of the flexible base layer 110. The buffer layer BU can prevent the diffusion of impurity ions, can prevent the penetration of moisture or external air, and can perform a surface planarization function. The buffer layer BU may include silicon nitride, silicon oxide, or silicon oxynitride. In some embodiments, the buffer layer BU may be omitted depending on process conditions and the like.

A semiconductor layer SM may be disposed on the buffer layer BU. The semiconductor layer SM may include single crystalline silicon, low-temperature polycrystalline silicon, amorphous silicon, or the like. However, the present inventive concept is not limited thereto, and in another embodiment, the semiconductor layer SM may include ITZO (oxide including indium, tin, and titanium) or IGZO (oxide including indium, gallium, and tin).

The gate insulation film GI may be disposed on the semiconductor layer SM. The gate insulation film GI may be made of an inorganic material, and may include, for example, silicon oxide, silicon nitride, silicon oxynitride, aluminum oxide, tantalum oxide, hafnium oxide, zirconium oxide, titanium oxide or the like.

A gate electrode GE may be disposed on the gate insulation film GI. The gate electrode GE may be connected to a gate line (not shown) extending along a first direction DR1 to receive a gate signal such as a gate voltage.

The interlayer insulation film ILD may be disposed on the gate electrode GE. The interlayer insulation film ILD may be made of an organic material or an inorganic material, and may be a single-layered film or a multi-layered film composed of a plurality of layers of different materials.

A source electrode SE and a drain electrode DE may be disposed on the interlayer insulation film ILD. Each of the source electrode SE and the drain electrode DE may be connected to the semiconductor layer SM through the interlayer insulation film ILD and the gate insulation film GI. The source electrode SE may be connected to a data line extending along a second direction DE2 to receive a data signal such as a data voltage.

The semiconductor layer SM, the gate electrode GE, the source electrode SE, and the drain electrode DE may constitute the thin film transistor TFT which is a switching element.

The planarization film PLA may be disposed on the source electrode SE and the drain electrode DE. In some embodiments, the planarization film PLA may be made of an organic material, but the present inventive concept is not limited thereto.

A first electrode E1 may be disposed on the planarization film PLA. The first electrode E1 may be connected to the drain electrode DE through the planarization film PLA. In some embodiments, the first electrode E1 may be an anode electrode.

The pixel defining film PDL that partially exposes the first electrode E1 may be disposed on the planarization film PLA. In some embodiments, the pixel defining film PDL may be made of an organic material.

An organic light emitting layer OL may be disposed on the first electrode E1 exposed by the pixel defining film PDL. In some embodiments, the organic light emitting layer OL may be made of a low-molecular organic material or a high-molecular organic material such as PEDOT (poly 3,4-ethylenedioxythiophene). The organic light emitting layer OL may be a multi-layered film including one or more of a hole injection layer (HIL), hole transporting layer (HTL), an electron transporting layer (ETL), and an electron injection layer (EIL).

A second electrode E2 may be disposed on the organic light emitting layer OL and the pixel defining film PDL. In some embodiments, the second electrode E2 may be a cathode electrode to which a common power supply (ELVSS) is connected.

The first electrode E1, the organic light emitting layer OL, and the second electrode E2 may constitute the light emitting element OLED.

The encapsulation unit 150 may be disposed on the light emitting element OLED. The encapsulation unit 150 may encapsulate the light emitting element OLED, and may prevent moisture or the like from being introduced into the light emitting element OLED from the outside. In some embodiments, the encapsulation unit 150 may completely cover the display unit 130.

The encapsulation unit 150 may be formed of a thin film encapsulation, and may include at least one organic film and at least one inorganic film. Illustratively, the encapsulation unit 150 may include a first inorganic film 151 disposed on the second electrode E2, an organic film 153 disposed on the first inorganic film 151, and a second inorganic film 155 disposed on the organic film 153.

The first inorganic film 151 can prevent moisture, oxygen, and the like from penetrating into the light emitting element OLED. The first inorganic film 151 may be made of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride (SiON).

The organic film 153 can improve flatness. The organic film 153 may be formed of a liquid organic material, for example, an acrylic resin, a methacrylic resin, polyisoprene, a vinyl resin, an epoxy resin, a urethane resin, a cellulose resin, or a perylene resin.

The second inorganic film 155 may have a function substantially the same as or similar to that of the first inorganic film 151, and may be made of a material substantially the same as or similar to that of the first inorganic film 151. The second inorganic film 155 may completely cover the organic film 153. In some embodiments, the second inorganic film 155 and the first inorganic film 151 may be in contact with each other in the non-display area NDA to form an inorganic-inorganic junction.

The driving circuit 200 may be disposed on the second region 110B of the flexible base layer 110. The driving circuit 200 may include a driving chip 210, an output bump unit 220 connected to the driving chip 210, and an input bump unit 230 spaced apart from the output bump unit 220 and connected to the driving chip 210.

In some embodiments, the driving chip 210 may be a data driver IC that provides a data signal or the like for driving the display unit 130.

The output bump unit 220 may output a driving signal for driving the display unit 130, and the input bump unit 230 may receive a control signal and a power supply provided from the circuit board unit 300. The plurality of output pump units 220 may be provided corresponding to a first pad 170 along the first direction DR1 and the second direction DR2, and may be spaced from the input bump unit 230 along the second direction DR2. The plurality of input pump units 230 may also be provided corresponding to a second pad 180 along the first direction DR1.

The first pad 170 and the second pad 180 may be disposed on the second region 110B of the flexible base layer 110. In some embodiments, the plurality of first pads 170 may be provided along the first direction DR1 and the second direction DR2, and may be spaced apart from the second pads 180 along the second direction DR2. The plurality of second pads 180 may be provided along the first direction DR1. The first pad 170 and the second pad 180 may be electrically connected to the driving circuit 200.

A first wiring unit 121 for electrically connecting the first pad 170 and the display unit 130 may be disposed on the flexible base layer 110. The first wiring unit 121 may be disposed not only on the second region 110B of the flexible base layer 110 but also on the first region 110A of the flexible base layer 110.

The circuit board unit 300 is connected to an external system and a power supply unit (not shown). The circuit board unit 300 supplies a control signal, a power supply, and the like to the display unit 130 and the driving circuit 200. The circuit board unit 300 is disposed on the second region 110B of the flexible base layer 110 and is farther from the display region DA than the driving circuit 200.

In some embodiments, the circuit board unit 300 may include a circuit board 310 and a circuit bump 320 connected to the circuit board 310.

The circuit board 310 may be a printed circuit board, and may be rigid or flexible. In some embodiments, a part of the circuit board 310 may be rigid, and the other part thereof may be flexible.

A circuit pad 190 may be further disposed on the second region 110B of the flexible base layer 110, and the circuit pad 190 may be electrically connected to the circuit board unit 300. In some embodiments, the first pad 170 and the second pad 180 may be disposed adjacent to the display area DA relative to the circuit pad 197. A second wiring unit 122 for electrically connecting the second pad 180 and the circuit pad 190 may be disposed on the second region 110B of the flexible base layer 110. In some embodiments, the plurality of circuit pads 190 may be provided corresponding to the circuit bump 320 along the first direction DR1.

The first pad 170 is a portion receiving a driving signal output from the driving circuit 200. The driving signal output from the driving circuit 200 may be provided to the display unit 130 via the first pad 170 and the first wiring unit 121.

The second pad 180 may be a portion for transmitting a control signal and a power supply provided from the circuit board unit 300 to the driving circuit 200, and the circuit pad 190 may be a portion receiving a control signal and a power supply provided from the circuit board unit 300.

The control signal and power supply provided from the circuit board unit 300 may be provided to the driving circuit 200 via the circuit pad 190, the second wiring unit 122, and the second pad 180.

The first pad 170 is electrically connected to the output bump unit 220, and the second pad 180 is electrically connected to the input bump unit 230.

An anisotropic conductive film ACF including an adhesive resin and conductive particles may be interposed between the first pad 170 and the output bump unit 220. The anisotropic conductive film ACF may also be interposed between the second pad 180 and the input bump unit 230.

In some embodiments, the driving circuit 200 may be mounted on the flexible base layer 110 through pressing and heating processes. Hereinafter, a specific arrangement of the output bump units 220 of the drive circuit 200 will be described with reference to FIG. 4.

Figure 4:
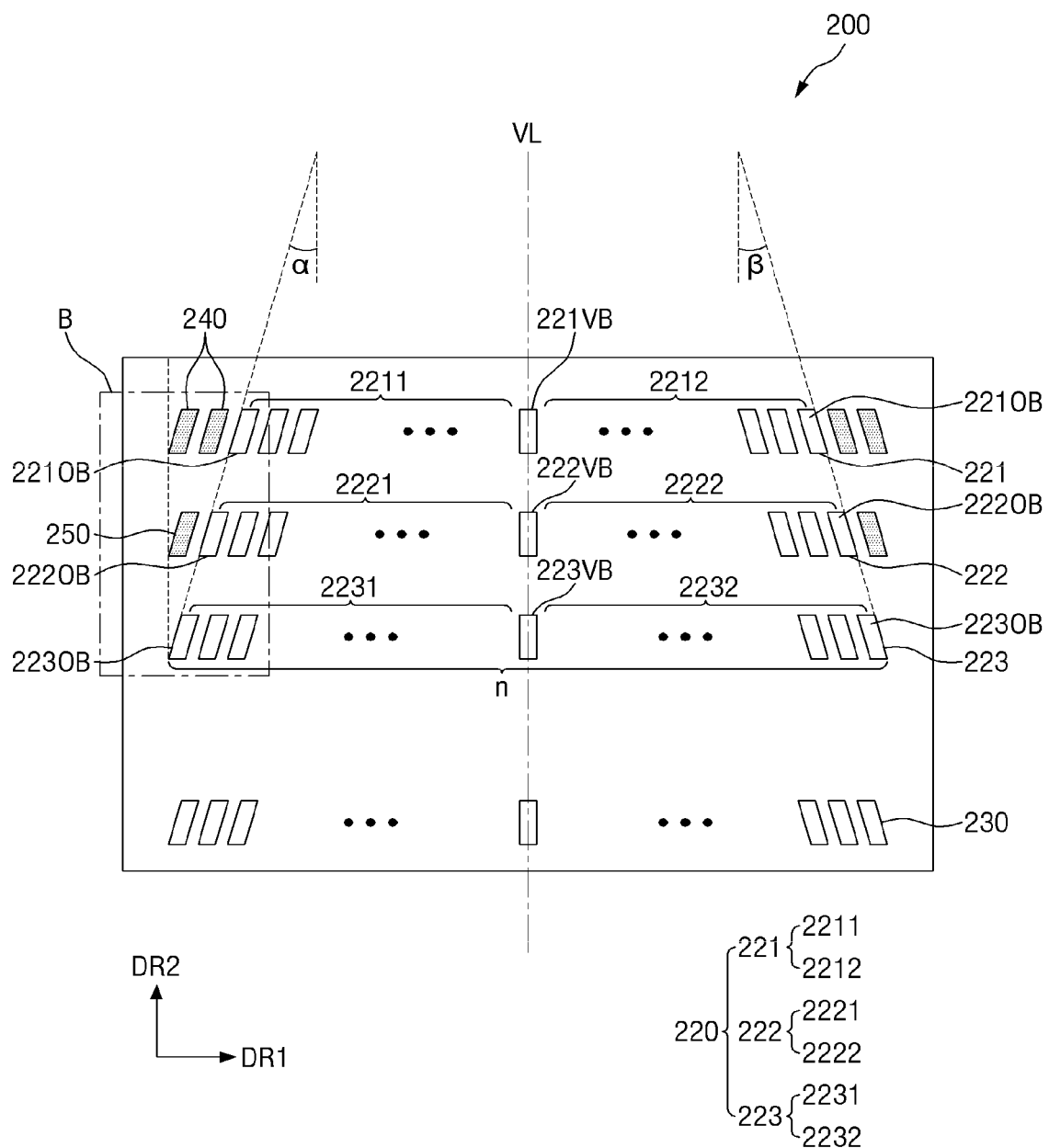
FIG. 4 is a plan view showing an arrangement of bump units of a driving circuit according to an embodiment.
Figure 5:
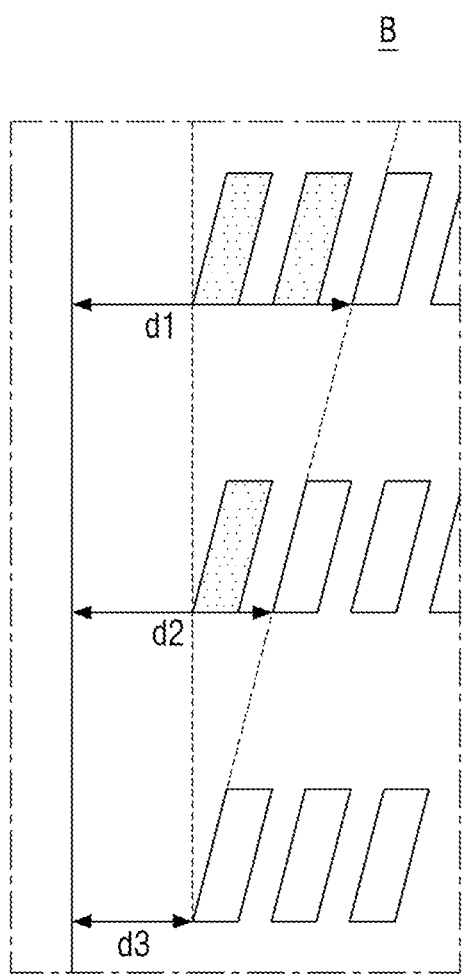
FIG. 5 is an enlarged cross-sectional view of area B in FIG. 4.

FIG. 4 is a plan view showing an arrangement of output bump units of a driving circuit according to an embodiment. FIG. 5 is an enlarged cross-sectional view of the area B in FIG. 4.

Referring to FIGS. 4 and 5, the output bump unit 220 may include a plurality of first output bumps 221, a plurality of second output bumps 222, and a plurality of third output bumps 223, which are arranged in the row direction (first direction DR1). That is, the first output bumps 221, the second output bumps 222, and the third output bumps 223 may be arranged along the first column, the second column, and the third column, respectively. Although an arrangement in which the output bump units 220 are arranged in three columns is shown in the drawing, the present inventive concept is not limited thereto, and an arrangement in which the output bump units 220 are arranged in two columns or in four or more columns may be provided.

The plurality of first output bumps 221, the plurality of second output bumps 222, and the plurality of third output bumps 223 may each include n bumps. That is, the number of bumps constituting the plurality of first output bumps 221, the plurality of second output bumps 222, and the plurality of third output bumps 223 may be the same. However, the present inventive concept is not limited thereto, and the number of bumps arranged in each column may be different depending on the structure of the display device.

The first reference bump 221VB disposed at the center among the plurality of first output bumps 221 and the second reference bump 222VB disposed at the center among the plurality of second output bumps 222 are disposed on a reference line VL defined in the second direction DR2. The third reference bump 223VB disposed at the center among the plurality of third output bumps 223 may also be disposed on the reference line VL.

The plurality of first output bumps 221 may include a plurality of eleventh output bumps 2211 disposed on the relatively left side of the first reference bumps 221VB and a plurality of twelfth output bumps 2212 disposed on the relatively right side of the first reference bumps 221VB.

The plurality of second output bumps 222, similarly to the plurality of first output bumps 221, may include a plurality of twenty-first output bumps 2221 disposed on the relatively left side of the second reference bumps 222VB and a plurality of twenty-second output bumps 2222 disposed on the relatively right side of the second reference bumps 222VB. The plurality of third output bumps 223 may also include a plurality of thirty-first output bumps 2231 disposed on the relatively left side of the third reference bumps 223VB and a plurality of thirty-second output bumps 2232 disposed on the relatively right side of the third reference bumps 223VB.

The plurality of eleventh output bumps 2211, the plurality of twenty-first output bumps 2221, and the plurality of thirty-first output bump 2231, which are arranged on the left side of the reference line VL, are respectively arranged to have a preset slope with respect to the reference line VL. The preset slope may be a slope having a constant value, that is, a predetermined slope. Specifically, the plurality of eleventh output bumps 2211, the plurality of twenty-first output bumps 2221, and the plurality of thirty-first output bump 2231 may be respectively arranged to form an acute angle α in the clockwise direction with respect to the reference line VL.

The plurality of twelfth output bumps 2212, the plurality of twenty-second output bumps 2222, and the plurality of thirty-second output bump 2232, which are arranged on the right side of the reference line VL, are respectively arranged to have a preset slope, that is, a predetermined slope, with respect to the reference line VL. Specifically, the plurality of twelfth output bumps 2212, the plurality of twenty-second output bumps 2222, and the plurality of thirty-second output bump 2232 may be respectively arranged to form an acute angle β in the counterclockwise direction with respect to the reference line VL.

When the number of the first output bumps 221 is the same as the number of the second output bumps 222, the slope of the n-th bump of the plurality of first output bumps 221 may be equal to the slope of the n-th bump of the plurality of second output bumps 222. Further, when the number of the first output bumps 221 is the same as the number of the third output bumps 223, the slope of the n-th bump of the plurality of first output bumps 221 may be equal to the slope of the n-th bump of the plurality of third output bumps 223.

The pitch between the plurality of first output bumps 221 may be smaller than the pitch between the plurality of second output bumps 222. The pitch between the plurality of second output bumps 222 may be smaller than the pitch between the plurality of third output bumps 223. That is, the interval between the bumps may increase from the plurality of first output bumps 221 to the plurality of third output bumps 223.

When the bump disposed farthest from the reference line VL is an outermost bump, the distance from the reference line VL to the first outermost bump 2210B may be shorter than the distance from the reference line VL to the second outermost bump 2220B. Further, the distance from the reference line VL to the second outermost bump 2220B may be shorter than the distance from the reference line VL to the third outermost bump 2230B. In other words, the bumps may be away from the reference line VL from the first outermost bump 2210B toward the third outermost bump 2230B.

When one short side of the driving chip 210 of the driving circuit 200 is taken as a reference, the first outermost bump 2210B may be disposed relatively inward relative to the second outermost bump 2220B and the third outermost bump 2230B. That is, the distance d1 from the short side of the driving chip 210 to the first outermost bump 2210B may longer than the distance d2 from the short side thereof to the second outermost bump 2220B, and may also be longer than the distance d3 from the short side thereof to the third outermost bump 2230B.

The driving circuit 200 may include a first additional bump 240 disposed in the same column as the plurality of first output bumps 221 and a second additional bump 250 disposed in the same column as the plurality of second output bumps 222.

The first additional bump 240 may be disposed in the first column, and may be disposed adjacent to the first outermost bump 2210B. The first additional bump 240 may be disposed between one short side of the driving chip 210 and the first output bump 221.

The first additional bump 240 and the second additional bump 250 may be driving bumps for outputting driving signals for driving the display unit 130, respectively.

The second additional bump 250 may be disposed in the second column, and may be disposed adjacent to the second outermost bump 2220B. The second additional bump 250 may be disposed between one short side of the driving chip 210 and the second output bump 222.

When the plurality of first output bumps 221, the plurality of second output bumps 222, and the plurality of third output bumps 223 each include n bumps, the number of total arranged bumps increases from the third column toward the first column. That is, the number of the total bumps arranged in the first column is equal to the sum of the number (n) of the plurality of first output bumps 221 and the number of the first addition bumps 240, and the number of the total bumps arranged in the second column is equal to the sum of the number (n) of the plurality of second output bumps 222 and the number of the second addition bumps 250. In some embodiments, four first additional bumps 240 may be provided, and two second additional bumps 250 may be provided. In this case, the total number of the bumps arranged in the first column is n+4, the total number of the bumps arranged in the second column is n+2, and the total number of the bumps arranged in the third column is n.

The first additional bumps 240 and the second additional bumps 250 may be arranged on the same row as the third outermost bump 2230B, or may be arranged inward from the third outermost bump 2230B.

The bumps disposed at the outer side of the first additional bump 240, the second additional bump 250, and the third outermost bump 2230B may be arranged in parallel with the reference line VL. That is, the bump disposed at the outermost side of the first additional bump 240 and the second additional bump 250 may be substantially aligned with the third outermost bump 2230B along the second direction DR2. In other words, each of the distance from one short side of the driving chip 210 to the first additional bump 240 and the distance from one short side thereof to the second additional bump 250 may be substantially equal to the distance d3 from one short side thereof to the third outermost bump 2230B.

The first additional bump 240 and the second additional bump 250 are spaced from the first side of the driving chip 210 by distances d1 and d2 from the first outermost bump 2210B to the second outermost bump 2220B, d2 can be compensated for the step differences due to the distance d1 from one short side of the driving chip 210 to the first outermost bump 2210B and the distance d2 from one short side thereof to the second outermost bump 2220B, respectively. Details thereof will be described with reference to FIGS. 6 and 7.

Figure 6:
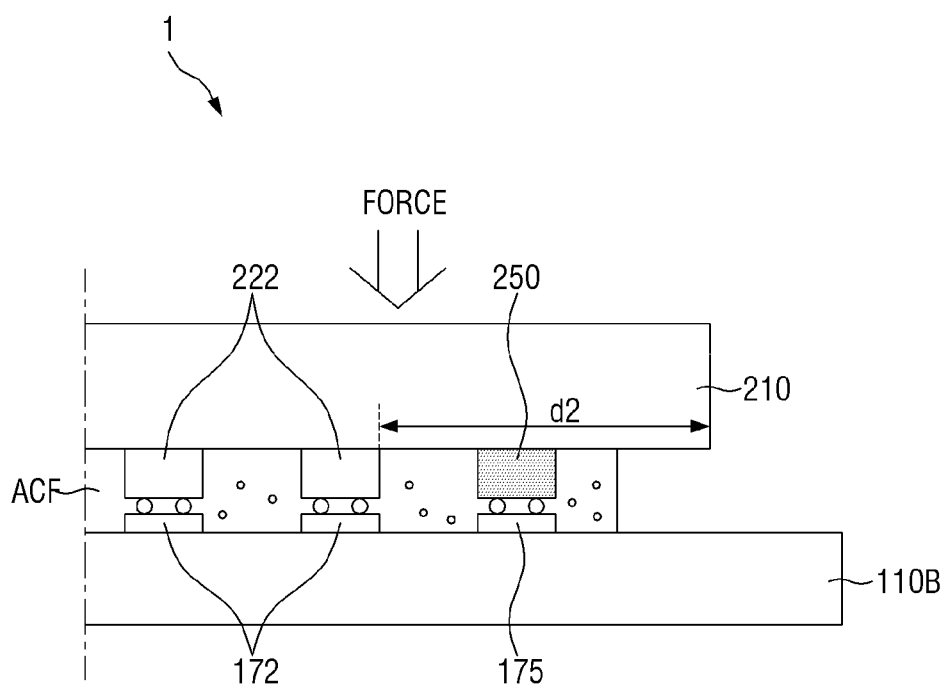
FIG. 6 is a cross-sectional view taken along the line V-V' in FIG. 1, in which a process of mounting a driving circuit is schematically shown.
Figure 7:
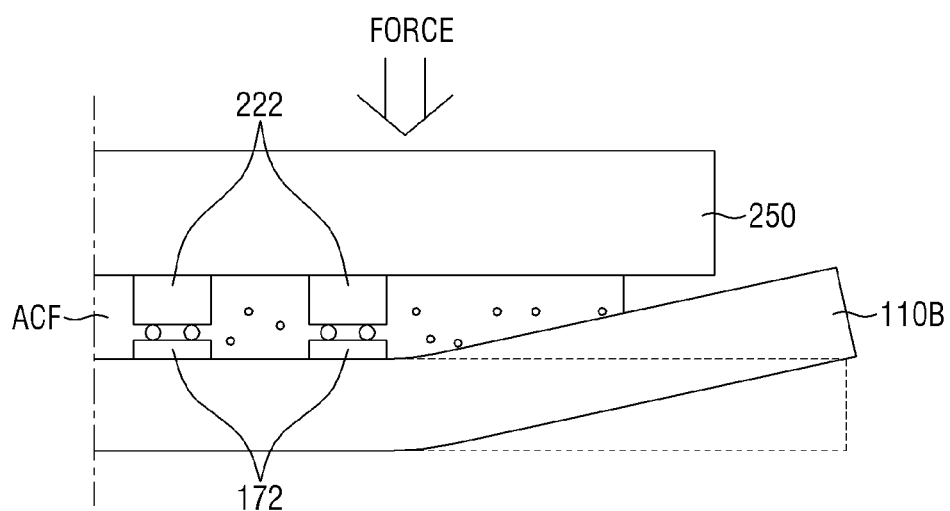
FIG. 7 is a cross-sectional view for explaining a process of mounting a driving circuit when additional bumps are omitted.

FIG. 6 is a cross-sectional view taken along the line V-V' in FIG. 1, in which a process of mounting a driving circuit is schematically shown. FIG. 7 is a cross-sectional view for explaining a process of mounting a driving circuit when additional bumps are omitted.

Referring to FIGS. 6 and 7, each of the bumps of the driving circuit 200 may be electrically connected to each of the pads of the flexible base layer 110 in a one-to-one correspondence.

A plurality of pads corresponding to the respective bumps of the driving circuit 200 may be disposed on the second region 110B of the flexible base layer 110.

In some embodiments, the plurality of bumps may be electrically connected to the plurality of pads in a one-to-one correspondence. Specifically, the second output pad 172 corresponding to the first output pump 222 on a one-to-one basis and the second additional pad 175 corresponding to the second output bump 222 on a one-to-one basis may be disposed on the second region 110B of the flexible base layer 110. Although not shown in the drawings, a plurality of first output pads corresponding to the plurality of first output bumps 221 on a one-to-one basis, a plurality of first additional pads corresponding to the plurality of first additional bumps 240 on a one-to-one basis, and a plurality of third output pads corresponding to the plurality of third output bumps 223 on a one-to-one basis may be arranged on the second region 110B of the flexible base layer 110.

The driving circuit 200 may be mounted on the flexible base layer 110 through pressing and heating processes. Specifically, the driving circuit 200 may be mounted on the flexible base layer 110 by applying pressure and heat onto the driving chip 210. Since the flexible base layer 110 has high flexibility as described above, the flexible base layer 110 can be easily bent by the externally applied pressure.

In the case of the first output bump 221 and the second output bump 222 which are disposed relatively inward relative to the third output bump 223, the position where the pressure is applied to the flexible base layer 110 is greatly spaced from the end of the second region 110B, so that a substantial portion of the second region 110B is bent as shown in FIG. 7. The bent second region 110B returns to its original flat shape by a restoring force. In this case, other layers (for example, the display unit 130 and the encapsulation unit 150) disposed on the flexible base layer 110 may be detached from the flexible base layer 110.

In contrast, when the second additional bump 250 is disposed adjacent to one end of the driving chip 210 as shown in FIG. 6, pressure is dispersed to a region adjacent to the end of the second region 110B, so that it is possible to prevent the flexible base layer 110 from being bent.

Although FIGS. 6 and 7 are described with reference to the second column in which the second output bumps 222 are disposed, even in the first column in which the first output bumps 221 are disposed, similarly to the second column, it is possible to prevent the flexible base layer 110 from being bent by the disposition of the first additional bump 240.

In this way, it is possible to prevent other layers from being detached from the flexible base layer 110, so that the durability and reliability of the display device 1 can be improved.

Hereinafter, display devices according to other embodiments will be described. In the following embodiments, a description of the same configuration as that of the previously described embodiment will be omitted or simplified, and differences will be mainly described.

Figure 8:
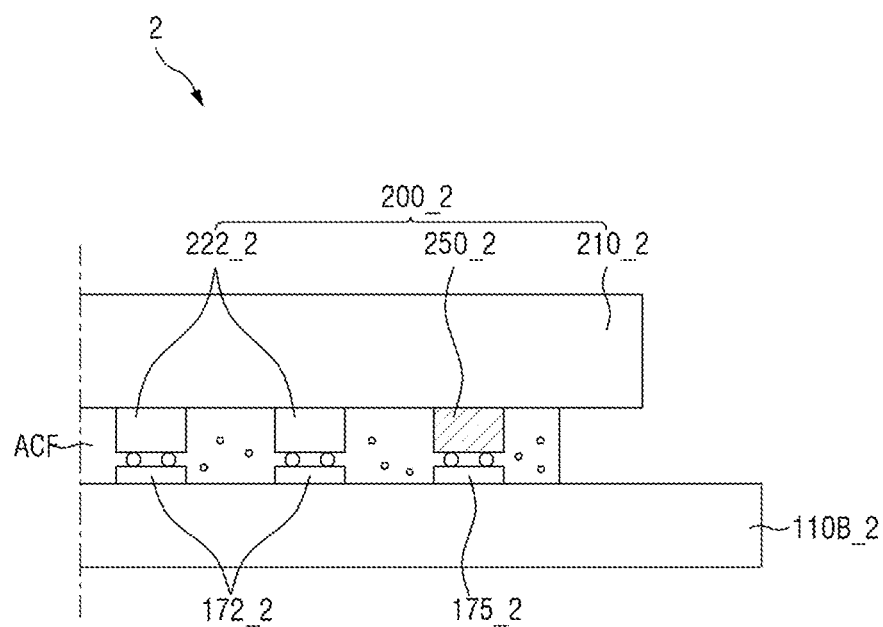
FIG. 8 is a cross-sectional view of a display device according to another embodiment.

FIG. 8 is a cross-sectional view of a display device according to another embodiment.

Referring to FIG. 8, a second additional bump 250_2 of a driving circuit 200_2 mounted in a display device 2 may be a dummy bump. The second additional bump 250 of the driving circuit 200 of the display device 1 is a driving bump that outputs a driving signal, whereas the second additional bump 250_2 may be a dummy bump that does not output a separate signal.

Although not shown in the drawing, the first additional bump of the driving circuit 200_2 may also be a dummy bump. That is, both the first additional bump and the second additional bump 250_2 may be dummy bumps. However, the present inventive concept is not limited thereto. The first additional bump may be a driving bump, and the second additional bump 250_2 may be a dummy bump.

Figure 9:
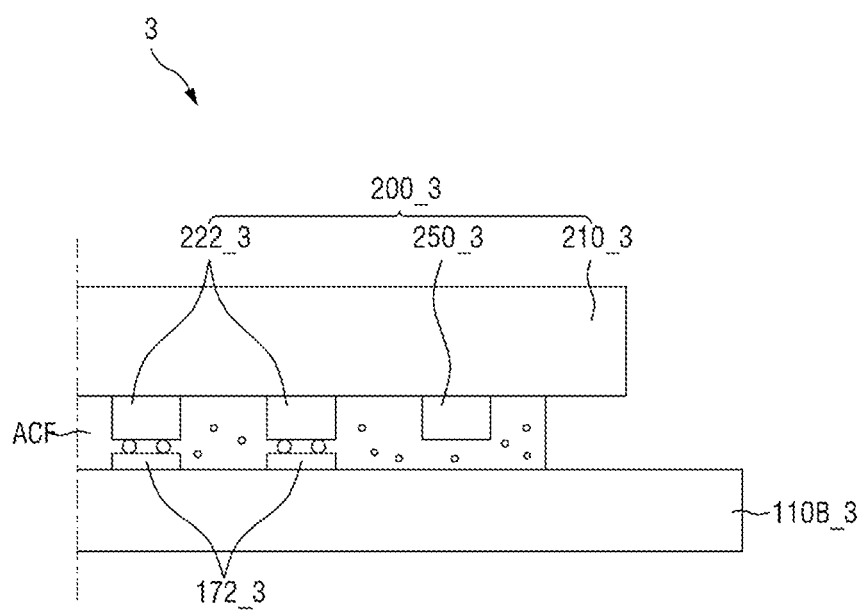
FIG. 9 is a cross-sectional view of a display device according to still another embodiment.

FIG. 9 is a cross-sectional view of a display device according to another embodiment.

Referring to FIG. 9, a second additional bump 250_3 of a driving circuit 200_3 mounted in a display device 3 may be a dummy bump, and a pad corresponding to the second additional bump 250_3 may be omitted.

Since the thickness of a pad disposed on a second region 110B_3 is thinner than the thickness of the second additional bump 250_3, even if the pad is omitted, it is possible to sufficiently prevent the flexible base layer 110_3 from being bent only by the second additional bump 250_3. Specifically, when the driving circuit 200_3 is mounted, a second region 110B_3 of a flexible base layer 110_3 is bent by the step difference between the lower surface of a driving chip 210_3 and the upper surface of the second region 110B_3. In this case, the thickness of the second additional bump 250_3 is sufficiently thick to compensate for the step difference between the driving chip 210_3 and the second region 110B_3, so that, even if the pad unit is omitted, it is possible to prevent the second region 110B_3 from being bent at the time of mounting the driving circuit 200_3.

Figure 10:
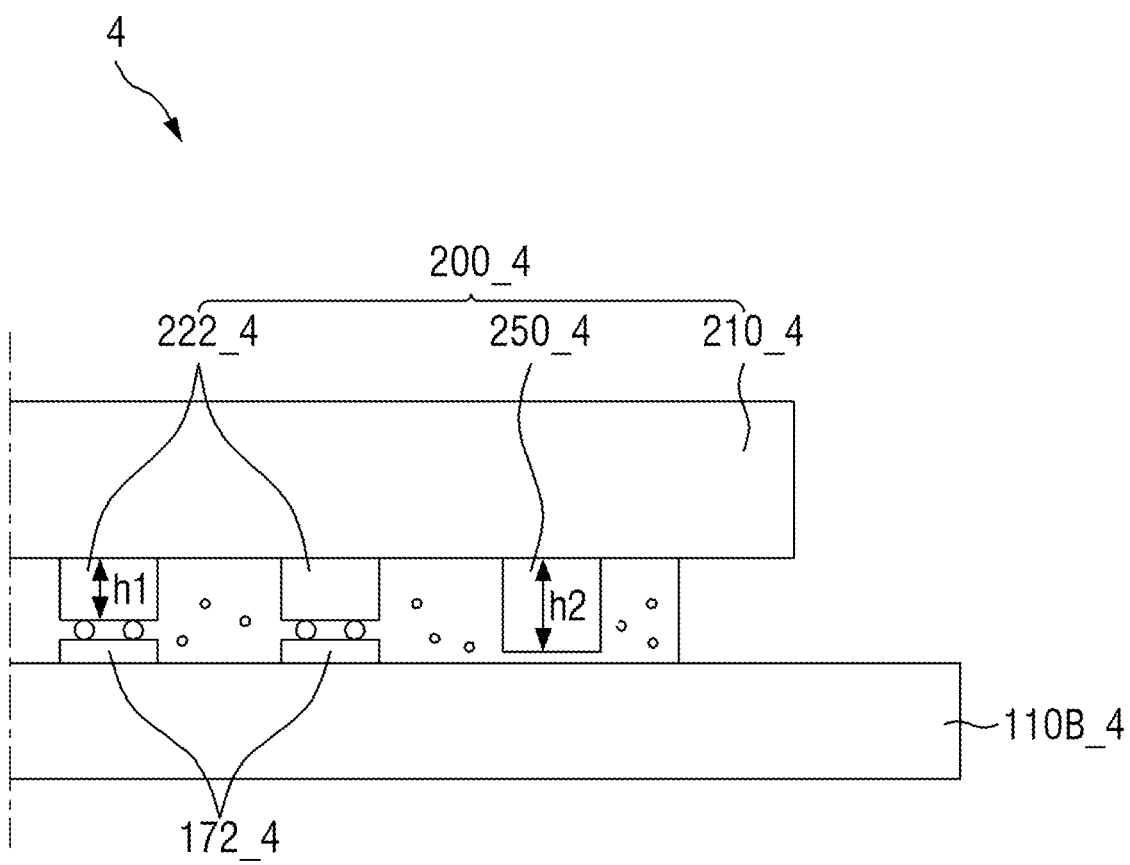
FIG. 10 is a cross-sectional view of a display device according to still another embodiment.

FIG. 10 is a cross-sectional view of a display device according to another embodiment.

Referring to FIG. 10, the thickness h1 of a second output bump 222_4 of a driving circuit 200_4 mounted in a display device 4 may be different from the thickness h2 of a second additional bump 250_4 thereof.

The thickness h2 of the second additional bump 250_4 may be thicker than the thickness h1 of the second output bump 222_4.

As the thickness h2 of the second additional bump 250_4 increases, the distance between the lower surface of the second additional bump 250_4 and the upper surface of a second region 110B_4 decreases. In this case, even if pressure is applied during the process of mounting the driving circuit 200_4, the pressure can be dispersed to the end of the second region 110B_4 through the second additional bump 250_4 to compensate for the bending of the second region 110B_4.

Figure 11:
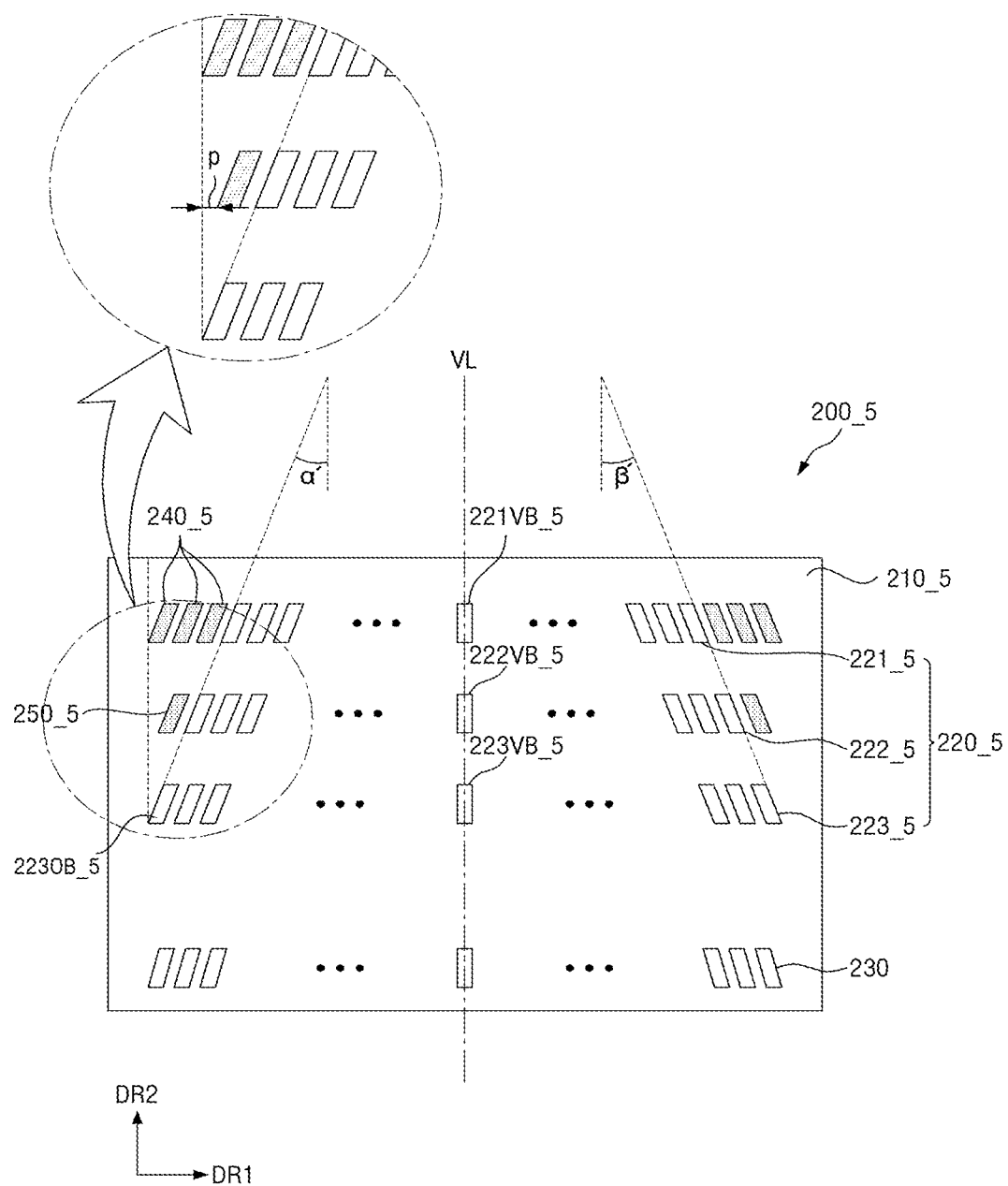
FIG. 11 is a plan view showing an arrangement of bump units of a driving circuit according to another embodiment.

FIG. 11 is a plan view showing an arrangement of bump units of a driving circuit according to another embodiment.

Referring to FIG. 11, in a driving circuit 200_5, second additional bumps 250_5 in the second column may be arranged inward relative to the outermost bump of first additional bumps 240_5.

The driving circuit 200_5 of FIG. 11 is different from the driving circuit 200 of FIG. 4 in that, in the driving circuit 200 of FIG. 4, the distance from one end of the driving chip 210 to the outermost first additional bump 240, the distance from one end thereof to the second additional bump 250, and the distance from one end thereof to the third outermost bump 2230B are the same as one another, whereas in the driving chip 200_5 of FIG. 11, the distance from one end of the driving chip 210_5 to the outermost first additional bump 240_5, the distance from one end thereof to the second additional bump 250_5, and the distance from one end thereof to the third outermost bump 2230B_5 are different from one another.

The distance p by which the leftmost side of the second additional bump 250_5 is spaced apart from the leftmost side of the third outermost bump 2230B_5 in the first direction DR1 may be about 30 μm or less.

Although it is shown in the drawing that the outermost bump of the first additional bumps 240_5 is substantially aligned with the third outermost bump 2230B_5 along the second direction DR2, the present inventive concept is not limited thereto, and the first additional bump 240_5 may also be spaced apart from the third outermost bump 2230B_5 in the first direction DR1. Even in this case, similarly to the distance p between the second additional bump 250_5 and the third outermost bump 2300B_5, the distance p by which the first additional bump 240_5 is spaced apart from the third outermost bump 2230B_5 in the first direction DR1 may be about 30 μm or less.

In other words, the differences among the shortest distance from one end of the driving chip 210_5 to the first additional bump 240_5, the shortest distance from one end thereof to the second additional bump 250_5, and the shortest distance from one end thereof to the third output bump 223_5, may be about 30 μm or less, respectively.

For example, the shortest distance from one end of the driving chip 210_5 to the first additional bump 240_5 may be greater than the shortest distance from one end thereof to the second additional bump 250_5 by about 30 μm.

The outermost bumps in the first column, the second column and the third column, that is, in the case of FIG. 11, the outermost bump of the first additions bumps 240_5, the second additional bump 250_5, and the third outermost bump 2230B_5 may be substantially aligned along the second direction DR2, and the distance between the respective bumps may be about 30 μm or less.

When each of the distances among the outermost bumps in the first direction DR1 is about 30 μm or more, since the distances from the one end of the driving chip 210_5 to the bumps are different from one another, the pressure applied to the flexible base layer 110 at the time of mounting the driving circuit 200_5 differs with respect to each section, so that the flexible base layer 110 may be bent and lifted up.

The arrangement slopes α' and β' of a plurality of first output bumps 221_5, a plurality of second output bumps 222_5, and a plurality of third output bumps 223_5 in the driving circuit 200_5 may be greater than the arrangement slopes α and β of the plurality of first output bumps 221, the plurality of second output bumps 222, and the plurality of third output bumps 223 in the driving circuit 200 of FIG. 4.

When the arrangement slopes α' and β' of the respective bumps 221_5, 222_5, and 223_5 increase, the length of the section in which the output bumps are arranged increases from the first column toward the third column. Thus, the difference between the shortest distance from one end of the driving chip 210_5 to the first output bump 221_5 and the shortest distance from one end thereof to the second output bump 222_5 may increase. The number of the first additional bumps 240_5 disposed between one end of the driving chip 210_5 and the first output bump 221_5 may be greater than the number of the first additional bumps 240 of FIG. 4. For example, the number of the first additional bumps 240_5 may be three. However, the present inventive concept is limited thereto, and the number of the first additional bumps 240_5 may be set to two, and the first additional bumps 240_5 may be arranged such that the distance therebetween increases.

Figure 12:
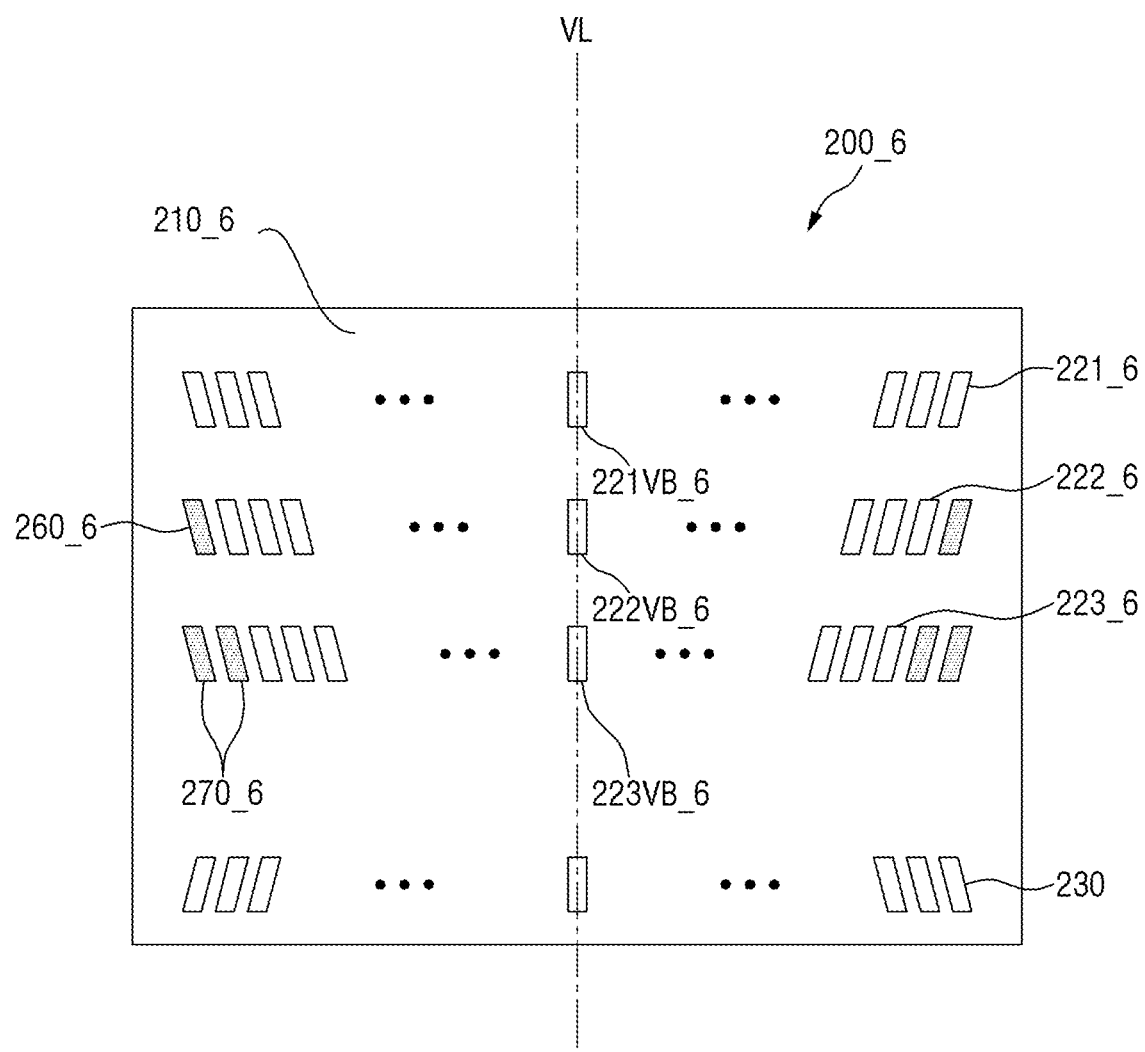
FIG. 12 is a plan view showing an arrangement of bump units of a driving circuit according to still another embodiment.

FIG. 12 is a plan view showing an arrangement of bump units of a driving circuit according to still another embodiment.

Referring to FIG. 12, a driving circuit 200_6 is different from the driving circuit 200 of FIG. 4 in that the arrangement angles of a plurality of first output bumps 221_6, a plurality of second output bumps 222_6 and a plurality of second output bumps 223_6 arranged in the driving circuit 200_6 are obtuse angles with respect to the reference line VL, respectively.

Specifically, the plurality of first output bumps 221_6 arranged at the left side of a first reference bump 221VB_6 are arranged at an obtuse angle in a clockwise direction with respect to the reference line VL, and the plurality of first output bumps 221_6 arranged at the right side of the first reference bump 221VB_6 are arranged at an obtuse angle in a counterclockwise direction with respect to the reference line VL.

A plurality of second output bumps 222_6 and a plurality of third output bumps 223_6 may also be arranged in the same manner as the first output bumps 221_6.

The length of the section in which the plurality of output bumps 221_6, 222_6, and 223_6 are arranged may decrease from the first column toward the third column. That is, the shortest distance from one end of a driving chip 210_6 to each of the output bumps 221_6, 222_6, and 223_6 may increase from the first column toward the third column.

A third additional bump 260_6 and a fourth additional bump 270_6 may be disposed in the second and third columns, respectively.

The third additional bump 260_6 may be disposed between one end of the driving chip 210_6 and the second output bump 222_6, and the fourth additional bump 270_6 may be disposed between one end of the driving chip 210_6 and the third output bump 223_6.

The total number of the plurality of bumps arranged in each column may increase from the first column toward the third column.

The distances from one end of the driving chip 210_6 to the bumps disposed at the outermost sides of each row may be substantially the same as each other.

Figure 13:
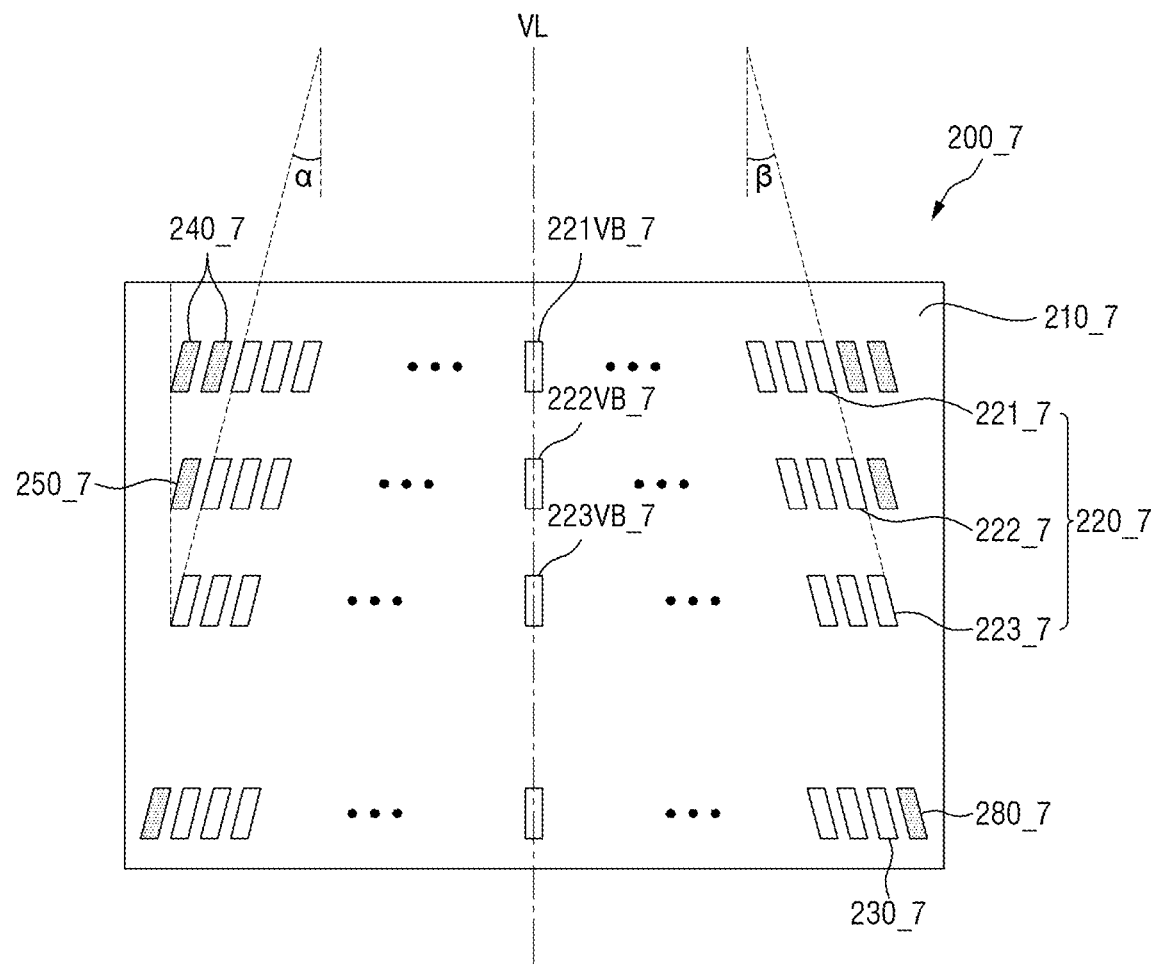
FIG. 13 is a plan view showing an arrangement of bump units of a driving circuit according to still another embodiment.

FIG. 13 is a plan view showing an arrangement of bump units of a driving circuit according to still another embodiment.

Referring to FIG. 13, a driving circuit 200_7 may include fifth additional bumps 280_7 disposed adjacent to an input bump unit 230_7.

The fifth additional bumps 280_7 may be disposed adjacent to both ends of a driving chip 210_7, specifically, between the both ends of the driving chip 210_7 and the input bump unit 230_7.

The fifth additional bumps 280_7 may decrease the distances from the end of the flexible base layer 110 to the bumps and disperse the pressure applied to the second region 110B during mounting the driving circuit 200_7, thereby preventing the second region 110B from being bent.

As described above, according to the embodiments of the present inventive concept, there can be provided a display device having improved durability and reliability.

The effects of the present inventive concept are not limited by the foregoing, and other various effects are anticipated herein.

Although the preferred embodiments of the present inventive concept have been disclosed for illustrative purposes, those skilled in the art will appreciate that various modifications, additions and substitutions are possible, without departing from the scope and spirit of the inventive concept as disclosed in the accompanying claims.

What is claimed is:

1. A display device, comprising:
   a substrate including a first region and a second region located around the first region;
   a display unit disposed on the first region and including a light emitting element;
   a pad portion disposed on the second region, the pad portion including a first pad array arranged in a first row and a second pad array arranged in a second row, the first row and the second row extending in a first direction;
   a driving circuit disposed on the second region and electrically connected to the pad portion;
   wherein the first pad array includes a plurality of first pads and a plurality of first additional pads disposed outward relative to the plurality of first pads,
   wherein the second pad array includes a plurality of second pads and a plurality of second additional pads disposed outward relative to the plurality of second pads, and
   wherein a number of the plurality of first additional pads in the first row is greater than a number of the plurality of second additional pads in the second row.

2. The display device of claim 1,
   wherein a number of the plurality of first pads in the first row and a number of the plurality of second pads in the second row are the same.

3. The display device of claim 2,
   wherein the plurality of first pads and the plurality of second pads are configured to receive a driving signal for driving the display unit.

4. A display device, comprising:
   a substrate including a first region and a second region different from the first region;
   a display unit disposed on the first region and including a light emitting element;
   a pad portion disposed on the second region, the pad portion including a first pad array arranged in a first row and a second pad array arranged in a second row, the first row and the second row extending in a first direction; and
   a driving circuit disposed on the second region electrically connected to the pad portion,
   wherein the first pad array includes a plurality of first pads and a plurality of first additional pads disposed outward relative to the plurality of first pads,
   wherein the second pad array includes a plurality of second pads and a plurality of second additional pads disposed outward relative to the plurality of second pads, and
   wherein a sum of a number of the plurality of first pads in the first row and a number of the plurality of first additional pads is greater than a sum of a number of the plurality of second pads in the second row and a number of the plurality of second additional pads.

5. The display device of claim 4,
   wherein the number of the plurality of first pads in the first row and the number of the plurality of second pads in the second row are the same.

* * * * *